US006724238B2

(12) United States Patent
Derner et al.

(10) Patent No.: US 6,724,238 B2
(45) Date of Patent: Apr. 20, 2004

(54) ANTIFUSE CIRCUIT WITH IMPROVED GATE OXIDE RELIABILITY

(75) Inventors: Scott J. Derner, Meridian, ID (US); Casey R. Kurth, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/449,217

(22) Filed: May 29, 2003

(65) Prior Publication Data

US 2003/0234679 A1 Dec. 25, 2003

Related U.S. Application Data

(63) Continuation of application No. 10/178,961, filed on Jun. 25, 2002, now Pat. No. 6,611,165.

(51) Int. Cl.[7] ............................................. H01H 37/76
(52) U.S. Cl. ....................................... 327/525; 327/534
(58) Field of Search ................................. 327/524, 525, 327/526, 530, 534, 535

(56) References Cited

U.S. PATENT DOCUMENTS

| | | | |
|---|---|---|---|
| 4,823,181 A | 4/1989 | Mohsen et al. | |
| 5,163,180 A | 11/1992 | Eltoukhy et al. | |
| 5,258,643 A | 11/1993 | Cohen | |
| 5,395,797 A | 3/1995 | Chen et al. | |
| 5,399,920 A | 3/1995 | Van Tran | |
| 5,461,333 A | 10/1995 | Condon et al. | |
| 5,631,862 A | 5/1997 | Cutter et al. | |
| 6,016,264 A | 1/2000 | Lin | |
| 6,333,666 B2 * | 12/2001 | Kim et al. | 327/525 |
| 6,344,766 B1 | 2/2002 | Mihara et al. | |
| 6,400,632 B1 * | 6/2002 | Tanizaki et al. | 365/225.7 |
| 6,525,983 B2 * | 2/2003 | Wilkins | 365/225.7 |

* cited by examiner

*Primary Examiner*—Jeffrey Zweizig
(74) *Attorney, Agent, or Firm*—TraskBritt

(57) ABSTRACT

An apparatus and method for improving the gate oxide reliability of an antifuse circuit is provided by coupling the gate input of a protection device of the antiftise circuit to a voltage converter circuit. In a program mode, a first voltage is applied through the voltage converter circuit to the gate input of the protection device to limit the voltage passed to internal transistor devices, thus increasing their gate oxide reliability. In a normal operation mode, however, a second, lower voltage is applied through the voltage converter to the gate input of the protection device to remove the large voltage stress placed across the gate oxide of the protection device itself. The voltage converter may attenuate the first voltage to create the second voltage or it may switch its output between the first and second voltage levels.

7 Claims, 4 Drawing Sheets

ANTIFUSE CIRCUIT WITH IMPROVED GATE OXIDE RELIABILITY

CROSS-REFERENCE TO RELATED APPLICATION

This application is a continuation of application Ser. No. 10/178,961, filed Jun. 25, 2002, now U.S. Pat. No. 6,611,165, issued Aug. 26, 2003.

BACKGROUND OF THE INVENTION

Field of the Invention

The present invention relates generally to antifuse circuits in integrated circuit devices. More specifically, the present invention relates to methods and apparatus for improving the gate oxide reliability in an antifuse latch circuit.

Antifuse latch circuits may be included in integrated circuit memory devices as part of an address detection circuit. Address detection circuits monitor the row and column addresses of integrated memory cell arrays and enable a redundant row or column within the array when the address of a defective row or column is received. U.S. Pat. No. 5,631,862 to Cutter et al., assigned to the assignee of the present invention and incorporated by reference herein in its entirety, discloses an antifuse bank address detection circuit that includes a bank of self-decoupling antifuse circuits.

For purposes of discussion, an exemplary self-decoupling antifuse latch circuit 10 is shown in FIG. 1. In a program mode, anti fuse latch circuit 10 may be programmed to blow antifuse 28. In a normal operation mode, latch output signal FA may be read to determine whether antifuse 28 has been blown or not. For example, latch output signal FA will be a logic high when antifuse 28 is blown and latch output signal FA will be a logic low when antifuse 28 is not blown.

Antifuse latch circuit 10 includes an output latch 12 and a latch control section 14. Output latch 12 includes three PMOS transistors 16, 18, 20, an inverter 22, and two NMOS transistors 24, 26. PMOS transistors 18, 20 are coupled in parallel with their sources coupled to the drain of PMOS transistor 16 and their drains coupled to the input of inverter 22. The gate of PMOS transistor 18 is coupled to signal RDFUS and the gate of PMOS transistor 20 is coupled to the output of inverter 22. The source of PMOS transistor 16 is coupled to voltage $V_{CC}$ and its gate is coupled to signal MRG. NMOS transistors 24, 26 are coupled in series between the drains of PMOS transistors 18, 20 and ground. The gate of NMOS transistor 24 is coupled to signal RDFUS and the gate of NMOS transistor 26 is coupled to the output of inverter 22. The output of inverter 22 is the latch output signal FA.

Latch control section 14 includes three NMOS transistors 30, 32, 34 and an antifuse 28. Antifuse 28 is coupled between signal CGND and the drain of NMOS drop transistor 30. As used herein, NMOS drop transistor 30 is also known as the "protection device." The gate of protection device 30 is coupled to voltage $V_{CCP}$ through protection device gate input 36 and its source is coupled to the drain of NMOS transistor 32 at control node 38. The gate of NMOS transistor 32 is coupled to the fuse selection signal FS and its source is coupled to signal BSEL. NMOS transistor 34 is coupled between control node 38 and the input of inverter 22 in the output latch 12. The gate of NMOS transistor 34 is coupled to signal DVC2F, which is typically $V_{CC}/2$+NMOS threshold voltage, $V_t$. Signal DVC2F may be used to limit the amount of voltage across the dielectric of unblown antifuses so that the antifuse dielectric does not receive a higher voltage stress across it that than the memory cells in the memory array. For example, if DVC2F=$V_{CC}/2$+NMOS Vt, then the maximum voltage across an unblown antifuse will be $V_{CC}/2$, which is what the cell plate of the array is typically set to.

Unblown antifuse 28 forms an open circuit. To blow antifuse 28, thus reducing its resistance and allowing current to flow through it, a voltage of approximately+12 Vdc is temporarily placed across its two terminals. This is accomplished by switching signal BSEL to ground, turning on NMOS transistor 32 by ensuring that fuse selection signal FS is a logic high and switching signal CGND to+12 Vdc. Note that protection device 30 does not need to be turned on to complete the path from anti fuse 28 to ground since the gate of protection device 30 is already coupled to voltage $V_{CCP}$. $V_{CCP}$ is typically $V_{CC}$+1.4 volts, or $V_{CC}$+the threshold voltage, $V_t$, of the access device+an additional voltage margin to cover process variation. While in this program mode, protection device 30 limits the maximum voltage applied to control node 38 to the voltage $V_{CCP}$ minus the threshold voltage $V_T$ of protection device 30. Thus, protection device 30 limits the drain-to-gate voltage of NMOS transistor 32 and the source-to-gate voltage of NMOS transistor 34 to limit the breakdown of the gate oxide and improve reliability. However, when antifuse 28 is blown, a large voltage stress is placed across the gate oxide of protection device 30. This high voltage stress can cause pinholes in the gate oxide of protection device 30 during the burn-in stress portion of the manufacturing process and can reduce the reliability of the antifuse latch circuit 10 during normal operation.

Thus, it would be advantageous to develop a technique and device for reducing or removing the high voltage stress placed across the gate oxide of the protection device 30 once the antifuse 28 has been blown and during normal operation of an antiflise latch circuit.

BRIEF SUMMARY OF THE INVENTION

The present invention relates to methods and apparatus for improving the gate oxide reliability in an antifuse latch circuit.

An antifuse latch circuit with improved gate oxide reliability according to the present invention includes a voltage converter circuit configured to selectively alter the voltage level applied to the gate input of a protection device of the antifuse latch circuit upon receiving a signal. In one embodiment of the invention, the voltage converter is configured to selectively reduce or increase the voltage level of a single signal to be applied to the protection device gate input. In another embodiment of the invention, the voltage converter is configured to selectively switch the protection device gate input between at least two voltage levels.

In yet another embodiment of the invention, the voltage converter circuit comprises a cascade voltage switch logic circuit coupled to the gates of two PMOS transistors. Each PMOS transistor is coupled between the protection device gate input and a separate and distinct voltage level. The cascade voltage logic circuit is configured to selectively switch the protection device gate input between the two voltage levels coupled to the two PMOS transistors.

A method of improving the gate oxide reliability in an antifuse latch circuit according to the present invention comprises applying a signal at a first voltage level to the gate of a protection device of an antifuse latch circuit during the programming of the antifuse and applying the signal at a second voltage level to the gate of the protection device during the reading of the antifuse and during normal operation.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

The drawings illustrate exemplary embodiments of the present invention, wherein, like reference numerals refer to like parts in different views or embodiments in the drawings.

DETAILED DESCRIPTION OF THE INVENTION

Figure 1:
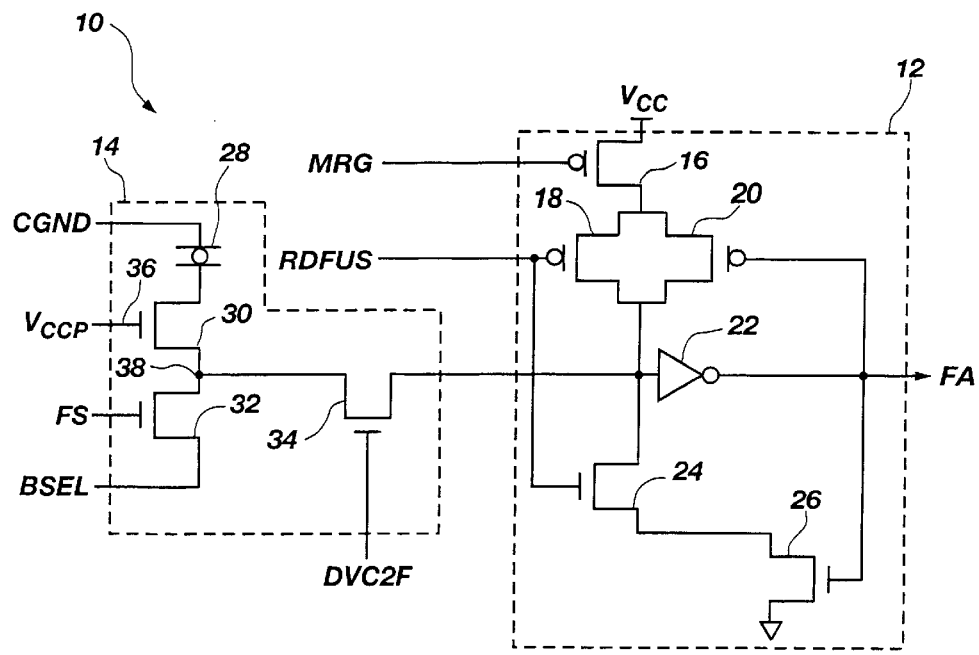
FIG. 1 is a schematic diagram of an exemplary antifuse latch circuit suitable for use with the present invention.

As discussed above, protection device 30 of FIG. 1 provides gate oxide protection for NMOS transistors 30, 32. During programming of antifuse 28, such protection is necessary since the large voltage (typically around+12 Vdc) provided by signal CGND in order to blow antifuse 28 would be present at control node 38, thus reducing the gate oxide reliability of NMOS transistors 30, 32. However, during reading of the fuses and during normal operation, signal CGND is switched to a ground potential. Therefore, the drain-to-gate voltage of NMOS transistor 32 and the source-to-gate voltage of NMOS transistor 34 no longer need to be limited to $V_{CCP}$ minus the threshold voltage $V_T$ of protection device 30. Thus, in order to improve the gate oxide reliability of protection device 30, the voltage applied to the gate of protection device 30 may be lowered.

Figure 2:
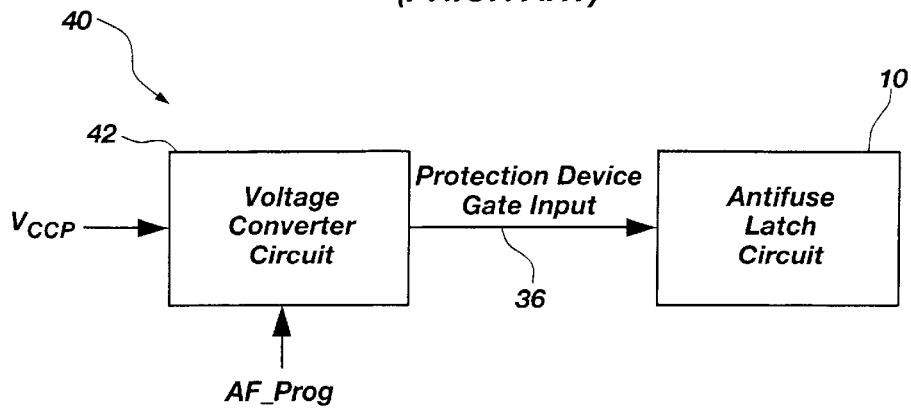
FIG. 2 is a block diagram of the anitifuse latch circuit of FIG. 1 coupled to a voltage converter circuit configured to selectively reduce or increase the voltage level of a single signal to be applied to the gate input of a protection device of the antifuse latch circuit.

FIG. 2 shows a block diagram of an embodiment of an improved antifuse latch circuit 40 according to the present invention. Improved antifuse latch circuit 40 may include antifuse latch circuit 10, as shown in FIG. 1, coupled to a voltage converter circuit 42 through protection device gate input 36. $V_{CC}$ may be approximately 2 volts, $V_{CCP}$ may be approximately 3.4 volts and $V_{CCR} < V_{CCP}$. Voltage converter circuit 42 is configured to receive voltage $V_{CCP}$, convert it to a lower voltage $V_{CCR}$ (FIG. 3) and output the lower voltage $V_{CCR}$ onto the protection device gate input 36. This can be accomplished by attenuating $V_{CCP}$, as is known in the art. As used herein, voltage $V_{CCR}$ is at a voltage level sufficiently below $V_{CCP}$ to provide the necessary gate oxide protection to protection device 30 of FIG. 1. Voltage $V_{CCR}$ may be a voltage signal typically used in integrated circuit devices and available to antifuse latch circuits.

Voltage converter circuit 42 may also be configured to convert voltage $V_{CCP}$ to the lower voltage upon receipt of signal AF_Prog. Thus, when signal AF_Prog indicates that the antifuse latch circuit 10 is in program mode, voltage converter circuit 42 will pass voltage $V_{CCP}$ through to protection device gate input 36. Conversely, when signal AF_Prog indicates that the antifuse latch circuit 10 is in normal operation mode, voltage converter circuit 42 will reduce the voltage $V_{CCP}$ it receives and output $V_{CCR}$ to the protection device gate input 36. One of ordinary skill in the art will recognize that voltage converter circuit 42 may, in the alternative, be configured to receive a lower voltage and increase the output on the protection device gate input 36 to voltage $V_{CCP}$ only during program mode.

Figure 3:
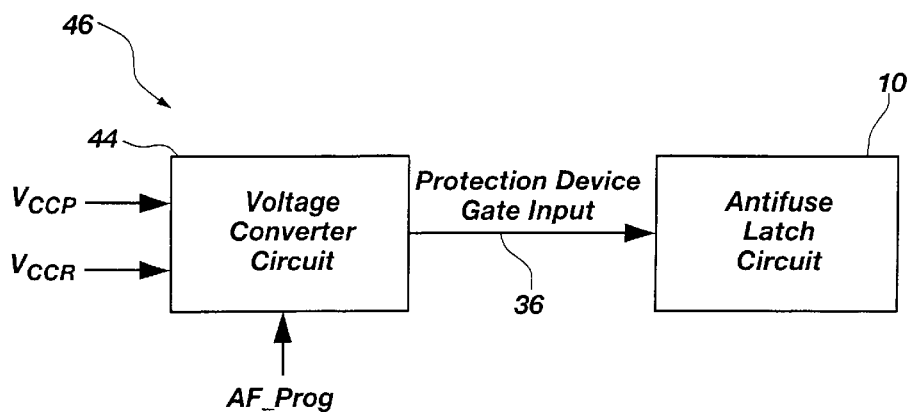
FIG. 3 is a block diagram of the antifuse latch circuit of FIG. 1 coupled to a voltage converter circuit configured to selectively switch the protection device gate input of the antifuse latch circuit between two voltage levels.

FIG. 3 shows a block diagram of another embodiment of an improved antifuse latch circuit 46 according to the present invention. Improved antifuse latch circuit 46 may include the antifuse latch circuit 10, as shown in FIG. 1, coupled to a voltage converter circuit 44 through protection device gate input 36. Voltage converter circuit 44 is configured to switch its output onto protection device gate input 36 between voltages $V_{CCP}$ and $V_{CCR}$. Voltage converter circuit 44 may also be configured to switch its output between $V_{CCP}$ and $V_{CCR}$ in response to signal AF_Prog. Thus, when signal AF_Prog indicates that the antifuse latch circuit 10 is in program mode, voltage converter circuit 44 will switch voltage $V_{CCP}$ to the protection device gate input 36. Conversely, when signal AF_Prog indicates that the antifuse latch circuit 10 is in normal operation mode, voltage converter circuit 44 will switch voltage $V_{CCR}$ to the protection device gate input 36.

Figure 4:
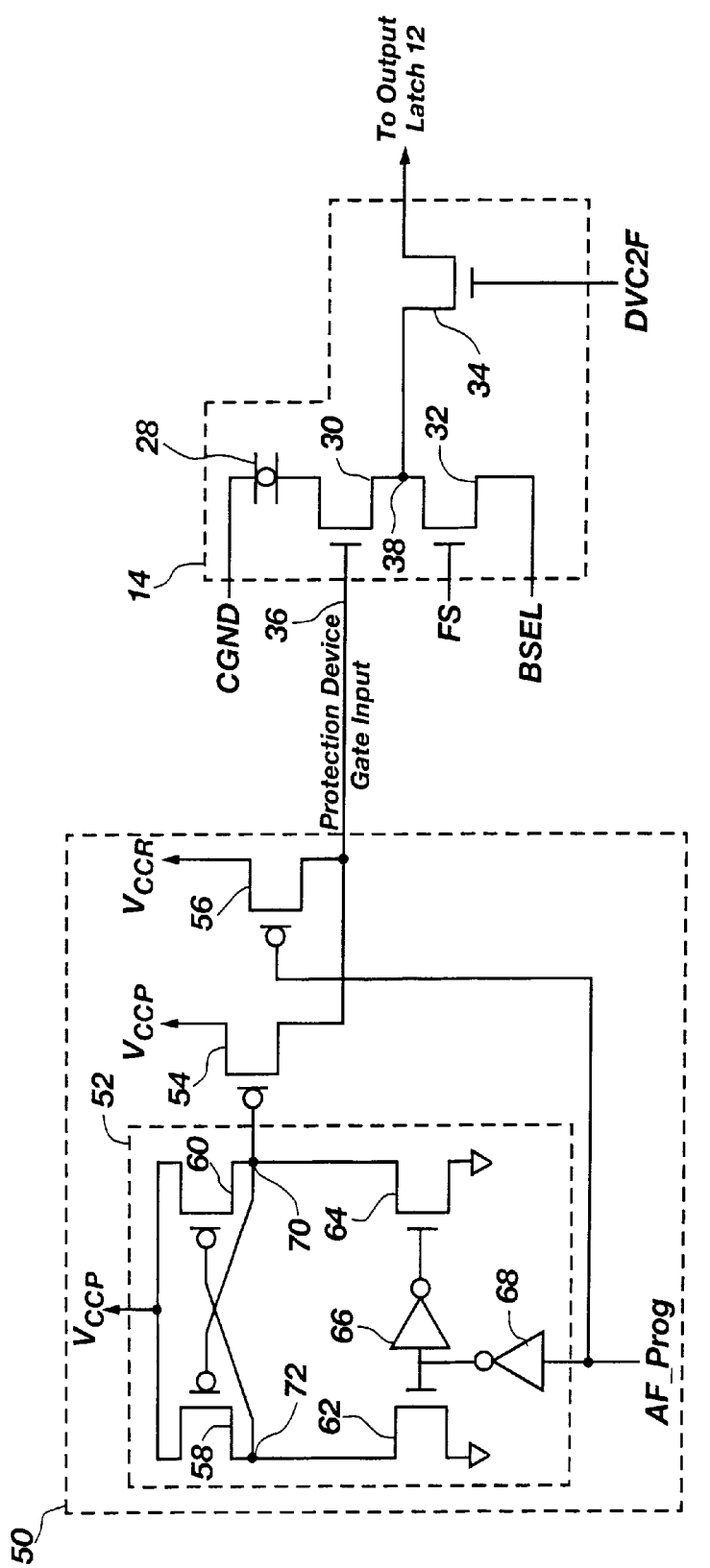
FIG. 4 is a schematic diagram of the antifuse latch circuit of FIG. 1 coupled to a voltage converter circuit comprising a cascade voltage switch logic circuit coupled to the gates of two PMOS transistors.

FIG. 4 shows a schematic diagram of the latch control section 14 of the antifuse latch circuit 10 of FIG. 1 coupled to a voltage converter circuit 50. For simplicity, the output latch 12 of the antifuse latch circuit 10 of FIG. 1 is not shown. Like voltage converter circuit 44 of FIG. 3, voltage converter circuit 50 is configured to switch its output onto protection device gate input 36 between voltages $V_{CCP}$ and $V_{CCR}$. Voltage converter circuit 50 comprises a cascade voltage switch logic circuit 52 coupled to the gates of two PMOS transistors 54, 56. As used herein, PMOS transistors 54, 56 are also referred to as "PMOS pull-up devices"54, 56.

Cascade voltage switch logic circuit 52 comprises two PMOS transistors 58, 60, two NMOS transistors 62, 64, and two inverters 66, 68. The sources of PMOS transistors 58, 60 are each coupled to voltage $V_{CCP}$. The gate of PMOS transistor 58 is coupled to the drain of PMOS transistor 60 at node 70 and the gate of PMOS transistor 60 is coupled to the drain of PMOS transistor 58 at node 72. The sources of NMOS transistors 62, 64 are coupled to ground. The drain of NMOS transistor 62 is coupled to the drain of PMOS transistor 58 at node 72. The gate of NMOS transistor 62 is coupled to the output of inverter 68 and the input of inverter 66. The drain of NMOS transistor 64 is coupled to the drain of PMOS transistor 60 at node 70 and its gate is coupled to the output of inverter 66. The input of inverter 68 is coupled to signal AF_Prog.

Signal AF_Prog is also coupled to the gate of PMOS transistor 56. The gate of PMOS transistor 54 is coupled to the cascade voltage switch logic circuit 52 at node 70. The protection device input gate 36 of antifuse latch circuit 10 is coupled to the drains of PMOS transistors 54, 56. The source of PMOS transistor 54 is coupled to voltage $V_{CCP}$ and the source of PMOS transistor 56 is coupled to $V_{CCR}$.

When signal AF_Prog is at logic high ($V_{CCR}$), indicating program mode has been entered, PMOS transistor 56 is turned off. Additionally, NMOS transistor 64 is turned on and a logic low passes from ground to node 70. The logic low at node 70 turns on PMOS transistor 54 to pull protection device gate input 36 to a voltage level of $V_{CCP}$. Therefore, during programming of antifuse 28, protection device gate input 36 may be switched to a voltage $V_{CCP}$ by setting signal AF_Prog to a high logic level in order to provide gate oxide protection for NMOS transistors 30, 32.

When signal AF_Prog is at logic low, indicating normal operation mode has been entered, NMOS transistor 64 is turned off and NMOS transistor 62 is turned on. As NMOS transistor 62 is turned on, node 72 is pulled down to ground. The logic low level at node 72 turns on PMOS transistor 60, which allows a high logic level of $V_{CCP}$ to pass to node 70 and turn PMOS transistor 54 off. Further, the logic low AF_Prog signal turns on PMOS transistor 56 to pull protection device gate input 36 to a level of $V_{CCR}$. Therefore, during reading of antifuse 28 and normal operation of antifuse latch circuit 10, protection device gate input 36 may be lowered to a voltage $V_{CCR}$ by setting signal AF_Prog to a low logic level in order to remove the large voltage stress placed across the gate oxide of protection device 30.

Figure 5:
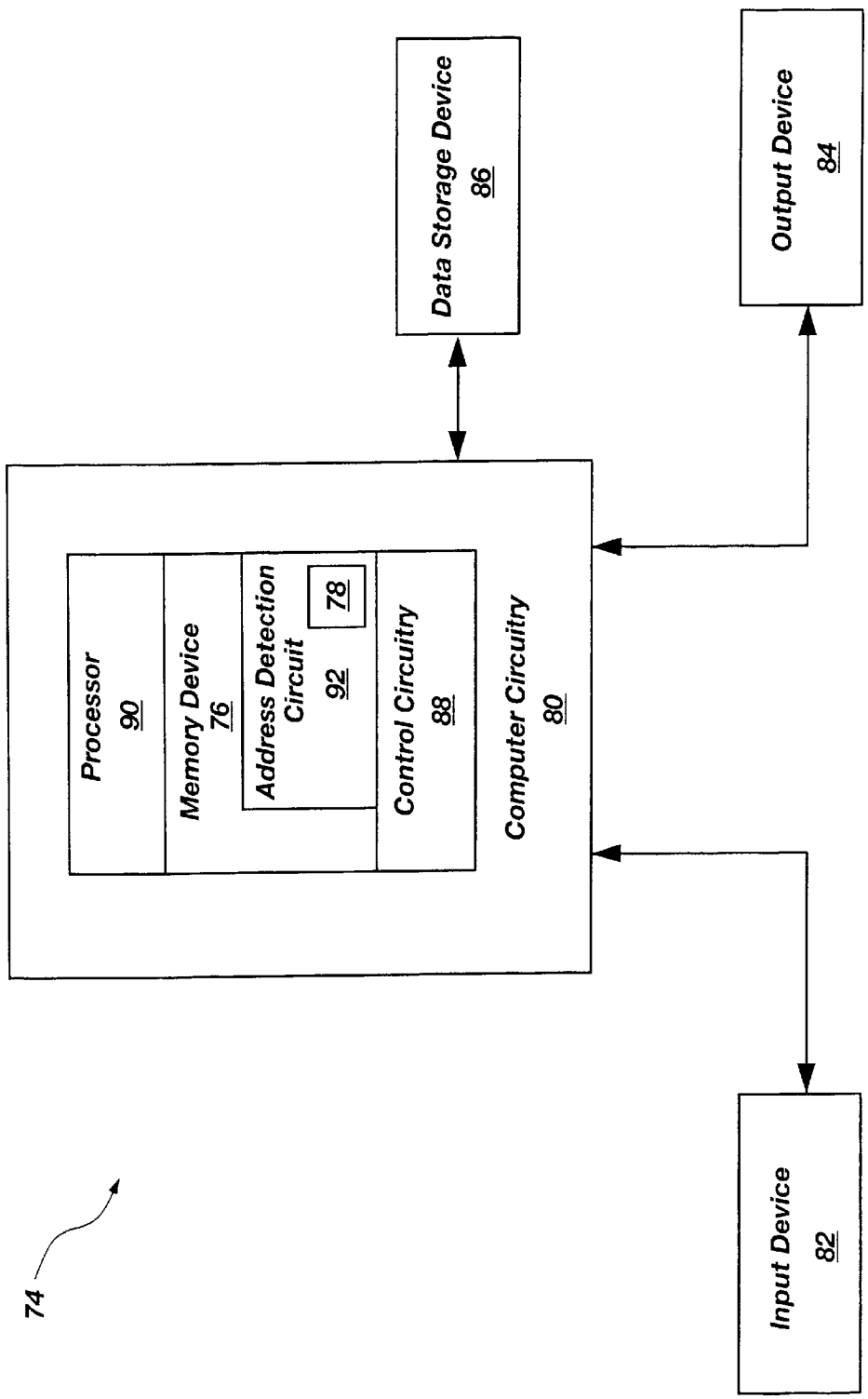
FIG. 5 is a block diagram of a computer system comprising a memory device using an address detection circuit with an improved anti fuse latch circuit according to the present invention.

FIG. 5 is a block diagram of a computer system 74 employing an improved antifuse latch circuit 78 according to the present invention. Computer system 74 may include computer circuitry 80 coupled to input device 82, output device 84 and data storage device 86. Computer circuitry 80 typically performs computer functions such as executing software to perform desired calculations and tasks. Computer circuitry 80 may include a processor 90, a memory device 76 and control circuitry 88. Control circuitry 88 may be used to produce the signals described in connection with FIGS. 2 through 4.

Input device 82 may include, by way of example only, an Internet or other network connection, a mouse, a keypad or any device that allows an operator to enter data into the computer circuitry 80. Output device 84 may include, by way of example only, a printer or a video display device. Data storage device 86 may include, by way of example only, a drive that accept hard and floppy discs, a tape cassette, CD-ROM or DVD-ROM drives. Memory device 76 may include an address detection circuit 92 comprising at least one antifuse latch circuit 78. Antifuse latch circuit 78 may comprise any one of the embodiments 42, 44 or 50 described above in connection with FIGS. 2 through 4.

Figure 6:
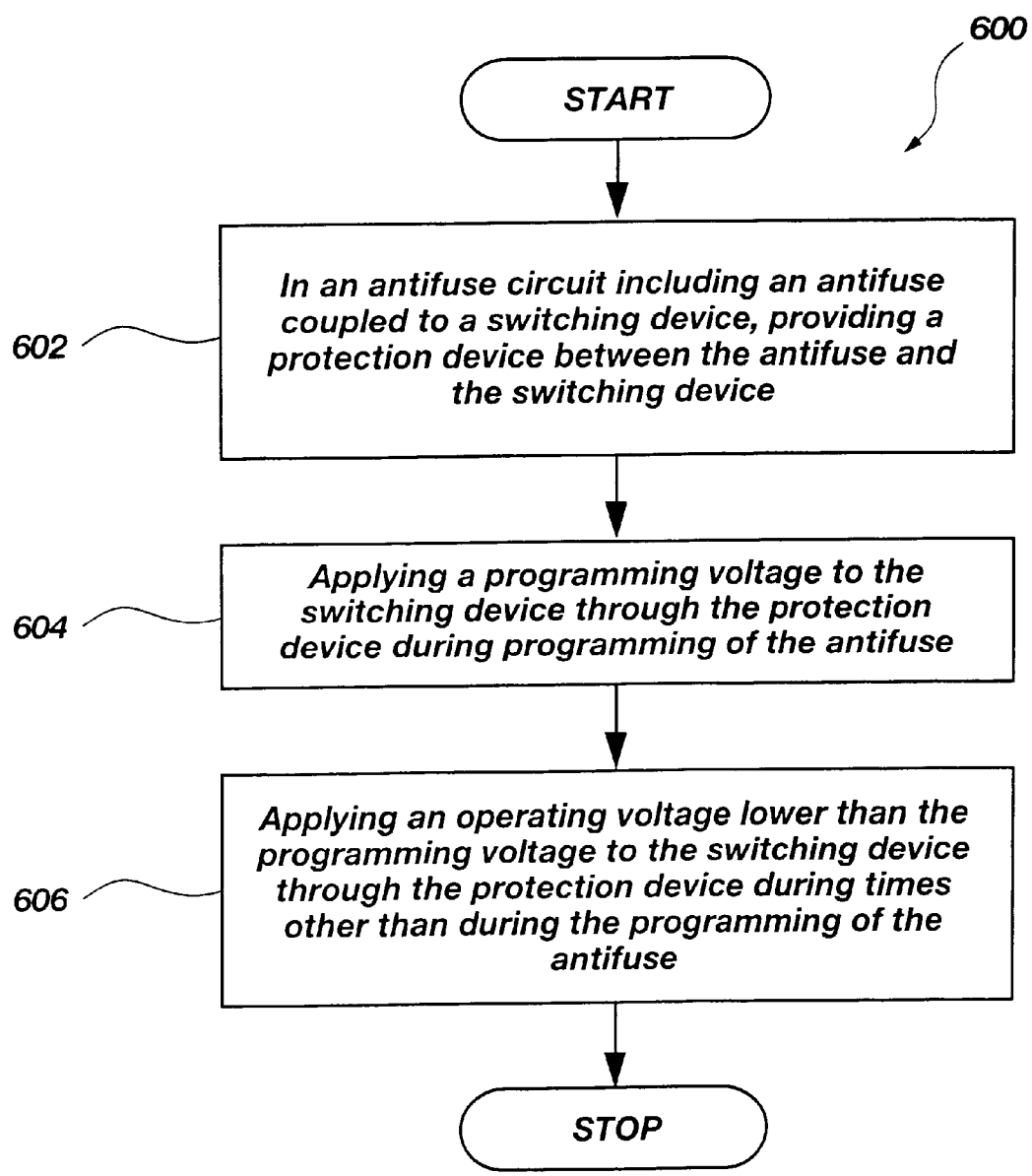
FIG. 6 is a flow chart of a method for improving the gate oxide reliability in an antifuse circuit including an antifuse coupled to a switching device.

FIG. 6 is a flow chart of a method 600 for improving the gate oxide reliability in an antifuse circuit including an antifuse coupled to a switching device. Method 600 may include providing 602 a protection device between the antifuse and the switching device. Method 600 may further include applying 604 a programming voltage to the switching device through the protection device during programming of the antiifuse and applying 606 an operating voltage lower than the programming voltage to the switching device through the protection device during times other than during the programming of the antifuse.

Another method is disclosed for improving the gate oxide reliability in an antifuse circuit including an antifuse and a protection device coupled between the antifuse and at least one transistor or switching device. The method may include in a first mode, limiting a maximum voltage coupled to the at least one transistor through the protection device by applying a first signal at a first voltage level to the protection device. The method may further include in a second mode, applying a second signal at a second voltage level, less than the first voltage level, to the protection device. According to this method, the antifuse may be blown, or programmed, in the first mode. Limiting the maximum voltage coupled to the at least one transistor increases the gate oxide reliability of the at least one transistor during the first mode. Applying the second signal at the second voltage level to the protection device increases the gate oxide reliability of the protection device during the second mode.

Applying the second signal at the second voltage level to the protection device may include receiving the first signal at the first voltage level, attenuating the first signal from the first voltage level to the second voltage level and applying the second voltage level to the protection device. Applying the first signal at the first voltage level in the first mode and the second signal at the second voltage level in the second mode to the protection device may include receiving the first signal at the first voltage level and the second signal at the second voltage level, switching an input to the protection device to the first signal during the first mode and switching the input to the protection device to the second signal during the second mode.

According to the circuit, system and method of the present invention, when signal AF_Prog is low, indicating normal operation in which $V_{CCR}$ is applied to the gate of the protection device, there still exists a voltage of $V_{CCP}$ across the gate oxide of a p-channel transistor in a voltage translator circuit. While this voltage of $V_{CCP}$ across the gate oxide of a p-channel transistor may still raise a potential gate oxide reliability problem for that p-channel transistor, this is still a significant improvement over conventional devices and methods.

The improvement in gate oxide reliability comes from placing the stress of $V_{CCP}$ across a single gate rather than hundreds or thousands of antifuse protection gates in a typical memory device. For example, in prior art devices, all of the gates of protection devices have $V_{CCP}$ connected to them, thus, all blown antifuses would have $V_{CCP}$ across the gate oxide. A typical 128 Mb dynamic random access memory (DRAM) has approximately 4000 antifuses on it. For a typical die, about half of the approximately 4000 antifuses are programmed and, thus, the protection devices attached to these antifuses are the candidates for gate oxide reliability problems. Therefore, the circuit, system and method of the present invention significantly reduces the gate oxide reliability problem of conventional devices and methods, by reducing the gate oxide area on the integrated circuit die exposed to the high programming voltage, $V_{CCP}$.

While the present invention has been disclosed in detail, those of ordinary skill in the art will recognize and appreciate that the invention is not so limited. Those of ordinary skill in the art will recognize and appreciate that many additions, deletions and modifications to the disclosed embodiment and its variations may be implemented without departing from the scope of the invention, which is limited only by the appended claims and their legal equivalents.

What is claimed is:

1. A voltage converter circuit for coupling with a protection device in an antifuse circuit, the voltage converter circuit comprising:
   a cascade voltage switch logic circuit including an input for coupling with programming signal and an output; and
   pull-up devices pulled to a higher voltage and a lower voltage based on assertion of the programming voltage.

2. The voltage converter circuit as recited in claim 1 wherein the pull-up devices comprises:
   a first pull-up device responsive to an output generated from assertion of the programming signal and pulled up to the higher voltage and further configured to couple with the protection device; and a second pull-up device responsive to deassertion of the programming signal and pulled up to the lower voltage and further configured to couple with the protection device.

3. A voltage converter circuit for coupling with a protection device, comprising:

a cascade voltage switch logic circuit having an output responsive to a programming signal;

a first pullup device responsive to the output and coupled to a higher voltage; and a second pullup device responsive to the programming signal and coupled to a lower voltage.

4. The voltage converter circuit of claim 3 wherein the cascade voltage switch logic circuit includes:

a first PMOS transistor having a source pulled up to the higher voltage;

a first NMOS transistor coupled to a drain of the first PMOS transistor;

a second PMOS transistor having a source pulled up to the higher voltage;

a second NMOS transistor coupled to a drain of the second PMOS transistor, and the drain of the first PMOS transistor coupled to a gate of the second PMOS transistor and the drain of the second PMOS transistor coupled to a gate of the first PMOS transistor and gates of the first and second NMOS transistors coupled to the programming signal.

5. An antifuse latch circuit comprising:

an antiftise;

a protection device coupled to the antiftise, the protection device having a gate input; and a voltage converter circuit configured to receive a higher voltage and convert the higher voltage into a lower voltage and output the lower voltage to the gate input of the protection device.

6. The antifuse latch circuit of claim 5 wherein the voltage converter circuit includes:

a cascade voltage switch logic circuit including an input for coupling with a programming signal and an output; and pullup devices pulled to a higher voltage and a lower voltage based on assertion of the programming voltage.

7. The antifuse latch circuit of claim 6 wherein the pullup devices comprise:

a first pullup device responsive to an output generated from assertion of the programming signal and pulled up to the higher voltage and further configured to couple with the protection device; and a second pullup device responsive to deassertion of the programming signal and pulled up to the lower voltage and further configured to couple with the protection device.

* * * * *

UNITED STATES PATENT AND TRADEMARK OFFICE
CERTIFICATE OF CORRECTION

PATENT NO. : 6,724,238 B2  Page 1 of 2
APPLICATION NO. : 10/449217
DATED : April 20, 2004
INVENTOR(S) : Scott J. Derner and Casey R. Kurth It is certified that error appears in the above-identified patent and that said Letters Patent is hereby corrected as shown below:

On the title page:
In item (57) Abstract, LINE 3, change "antifise" to --antifuse--

| | | | |
|---|---|---|---|
| | COLUMN 1, | LINE 30, | change "anti fuse" to --antifuse-- |
| | COLUMN 2, | LINE 1, | delete "that" |
| | COLUMN 2, | LINE 3, | change "Vt," to --$V_t$,-- |
| | COLUMN 2, | LINE 8, | change "approximately+12" to --approximately +12-- |
| | COLUMN 2, | LINE 12, | change "to+12" to --to + 12-- |
| | COLUMN 2, | LINE 14, | change "anti fuse" to --antifuse-- |
| | COLUMN 2, | LINE 16, | change "$V_{cc}$+1.4" to --$V_{cc}$ + 1.4-- and change "$V_{cc}$+the" to --$V_{cc}$ + the-- |
| | COLUMN 2, | LINE 17, | change "device+an" to --device + an-- |
| | COLUMN 2, | LINE 35, | change "antiflise" to --antifuse-- |
| | COLUMN 3, | LINE 13, | change "anitifuse" to --antifuse-- |
| | COLUMN 3, | LINE 29, | change "anti fuse" to --antifuse-- |
| | COLUMN 3, | LINE 40, | change "around+12" to --around + 12-- |
| | COLUMN 5, | LINE 41, | change "accept" to --accepts-- |
| | COLUMN 5, | LINE 54, | change "antiifuse" to --antifuse-- |
| | COLUMN 5, | LINE 65, | insert a comma after "include" |
| | COLUMN 6, | LINE 20, | insert a comma after "system" |
| | COLUMN 6, | LINE 41, | insert a comma after "system" |
| CLAIM 1, | COLUMN 6, | LINE 60, | change "with programming" to --with a programming-- |
| CLAIM 1, | COLUMN 6, | LINE 63, | change "voltage." to --signal.-- |
| CLAIM 2, | COLUMN 6, | LINE 65, | change "comprises:" to --comprise:-- |
| CLAIM 3, | COLUMN 7, | LINE 11, | change "pullup" to --pull-up-- |
| CLAIM 3, | COLUMN 7, | LINE 13, | change "pullup" to --pull-up-- |
| CLAIM 4, | COLUMN 7, | LINE 26, | change "transistor," to --transistor;-- |
| CLAIM 4, | COLUMN 7, | LINE 28, | change "transistor and the" to --transistor, the-- |
| CLAIM 5, | COLUMN 8, | LINE 2, | change "antiftise;" to --antifuse;-- |
| CLAIM 5, | COLUMN 8, | LINE 3, | change "antiftise," to --antifuse,-- |

UNITED STATES PATENT AND TRADEMARK OFFICE
CERTIFICATE OF CORRECTION

PATENT NO. : 6,724,238 B2
APPLICATION NO. : 10/449217
DATED : April 20, 2004
INVENTOR(S) : Scott J. Derner and Casey R. Kurth It is certified that error appears in the above-identified patent and that said Letters Patent is hereby corrected as shown below:

| | | | |
|---|---|---|---|
| CLAIM 6, | COLUMN 8, | LINE 16, | change "pullup" to --pull-up-- |
| CLAIM 6, | COLUMN 8, | LINE 17, | change "voltage." to --signal.-- |
| CLAIM 7, | COLUMN 8, | LINE 18, | change "pullup" to --pull-up-- |
| CLAIM 7, | COLUMN 8, | LINE 20, | change "pullup" to --pull-up-- |
| CLAIM 7, | COLUMN 8, | LINE 25, | change "pullup" to --pull-up-- |

Signed and Sealed this

Twenty-fourth Day of October, 2006

JON W. DUDAS
*Director of the United States Patent and Trademark Office*